United States Patent [19]

Walde et al.

[11] Patent Number: 4,907,526

[45] Date of Patent: Mar. 13, 1990

[54] INSTALLATION FOR CHARGING AND DISCHARGING SUBSTRATES OUT OF A VACUUM TANK

[75] Inventors: Michael Walde, Rodenbach; Peter Zeidler, Hanau; Dirk Domroese, Bispingen-Behringen, all of Fed. Rep. of Germany

[73] Assignee: Leybold Aktiengesellschaft, Hanau, Fed. Rep. of Germany

[21] Appl. No.: 217,941

[22] Filed: Jul. 12, 1988

[30] Foreign Application Priority Data

May 3, 1988 [DE] Fed. Rep. of Germany ....... 3814924

[51] Int. Cl.⁴ .............................................. B05C 13/00
[52] U.S. Cl. ....................................... 118/50; 118/500
[58] Field of Search ...................... 414/217, 793, 792.9; 156/345; 118/50, 50.1, 719, 728, 729, 733, 500

[56] References Cited

U.S. PATENT DOCUMENTS

| | | | |
|---|---|---|---|
| 4,500,407 | 2/1985 | Boys et al. | 118/50 |
| 4,550,239 | 10/1985 | Uehara et al. | 156/345 |
| 4,657,620 | 4/1987 | Davis et al. | 156/345 |
| 4,659,413 | 4/1987 | Davis et al. | 156/345 |
| 4,676,884 | 6/1987 | Dimock et al. | 118/50 |
| 4,685,852 | 8/1987 | Rubin et al. | 118/729 |
| 4,687,542 | 8/1987 | Davis et al. | 118/729 |
| 4,693,777 | 9/1987 | Hazano et al. | 118/50 |
| 4,697,974 | 10/1987 | Eltoukhy | 118/729 |
| 4,709,655 | 12/1987 | Van Mastrigt | 118/50.1 |
| 4,724,874 | 2/1988 | Parikh et al. | 414/217 |
| 4,775,281 | 10/1988 | Prentakis | 118/729 |
| 4,776,745 | 10/1988 | Foley | 118/729 |
| 4,781,511 | 11/1988 | Harada et al. | 118/50 |
| 4,801,241 | 1/1989 | Zajac et al. | 414/217 |
| 4,816,638 | 3/1989 | Ukai et al. | 156/345 |

Primary Examiner—Willard Hoag
Attorney, Agent, or Firm—Felfe & Lynch

[57] ABSTRACT

In apparatus for charging and discharging substrates, substrates are disposed in a magazine or substance store and into the pre-chamber of a high-vacuum-processing-chamber which is made as a vacuum chamber, the magazine being pushed into a housing, which at its lower side provides an opening. The housing can be deposited with the magazine onto the upper part of the wall of the lower box, an air lock plate held below an opening in the upper part of the wall taking the magazine and lowering it into a lower position by means of a pair of lifting cylinders. After this the air lock plate with the magazine and the pair of lifting cylinders are movable laterally on a conveying-slide-carriage, until the air lock plate is positioned below the passage of opening in the bottom part of the vacuum chamber. Eventually the air lock plate can be moved so far up in a vertical direction, until the magazine is disposed in the pre-chamber and until the air lock plate, which is a little bigger, closes the opening of passage.

8 Claims, 5 Drawing Sheets

INSTALLATION FOR CHARGING AND DISCHARGING SUBSTRATES OUT OF A VACUUM TANK

The invention relates to an installation for charging and discharging substrates out of a vacuum tank, especially into the pre-chamber of a high-vacuum-processing-chamber for the treatment of the surface of the substrates.

It is generally known, that in the process of coating or plasma-etching of substrates, for example in the case of data loggers in a high vacuum processing chamber it is very important, that the substrates are treated under conditions of a clean space. This means the substrates have to be completely free of dust or if any other suspended particles, which are constantly present in non-purified air. Therefore it is already a common practice to design the rooms, in which the proper coating or etching installations are set up as clean spaces. That means that the air, before entering into such rooms has to pass through filters, and that all the installations disposed in that room have to be cleaned with a special method. The staff operating the installations needs to wear a special type of clothing and for the rest has to adopt special habits. However, the treatment of substrates under such conditions of cleanness requires a considerable financial expense, and is accompanied by a multitude of inconveniences. Finally clean spaces conceived in such a way can guarantee only a limited quality of tidiness.

A certain progress towards a solution of the problems related to contamination and the flow of material is found in the preservation and transportation of the substrates in standardized boxes or containers. These boxes, which comprise a magazine for holding the substrates, provide at their lower side a special locking mechanism, with a corresponding counter-piece at each individual installation. Thus inside the chamber of the installation a small clean space, separated from the outer clean space is formed. When the installation is loaded and unloaded with such boxes, the two locking plates at the box and at the installation open at the same time, so that the particles between the two outer sides of the locking plates, which are covered with dirt particles, are closed in, and eventually come into the installations.

Therefore it is the object of the present invention, to provide an installation of the type mentioned above, which allows to transport a magazine, disposed in a box and filled with substrates, out of a clean room into an installation, for example a vacuum coating installation, under conditions of clean space and which eventually allows to treat and discharge the substrates out of the installation into the magazine or the box. The installation will also guarantee, that all dust particles which came onto the magazine during the charging and discharging and the transportation from the box into the vacuum chamber are washed away or eliminated from the magazine and the substrates, so that a treatment of the substrates is rendered possible under substantially dust-free conditions. This object is obtained pursuant to the invention by the fact, that the substrates are disposed in a substrate-holder, a substrate-store-holder or in a magazine, which can be put onto an air lock plate at the installation, the holder, the store-holder or the magazine being enclosed by a housing, the lower side of which is open and a rotating margin-part of which rests on the upper part of the wall of the lower box, which encloses the installation, the air lock plate being conveyable in vertical and/or horizontal direction by means of a lifting appliance, the housing resting sealing on the lower box and closing the charge-opening for the magazine, and after this the air lock plate can be displaced up to an opening of passage to the lower box and can be closed by the air lock plate.

The lifting appliance is preferably formed by a conveying-sliding-carriage, which is disposed gliding on horizontally arranged bars or rods, the conveying sliding carriage providing lifting cylinders, the piston rods or lifting-members of which support the coping level of lock, t which a driving unit is attached, which reacts on a post, at the free end of which a bearer plate is disposed, which serves for the holding of the magazine.

Suitably the lower box of the installation provides an outlet opening for an air current flowing through and is connected to a motor-blower-unit over a piping-conduit.

The lifting appliance is enclosed at least partly by a cage, composed of perforated or ribbed plates, the air-current entering over the piping-conduit being fashioned in a laminar flow at least as long as it flows through the cage. Thus all the dust produced during the transport of the magazine with the installation in the lower box are absorbed by the air flowing cross-wise through the lower box and are carried out of the outlet opening in the lower part of the lower box.

Advantageously the housing for the magazine holding the substrates, which rests on the upper part of the wall of the lower box, provides a frame-part embracing the opening on the lower side of the magazine, the inside width of which corresponds approximately to the inside width of charge-opening [air-lock opening]. Therefore this frame-part providing an annular or a loop-type [frame-shaped] sealing sits so tightly on the upper part of the wall, that no dirt particles, abrasion or something of that kind can penetrate into the lower box through the opening provided in the upper part of the wall.

In a preferred example of embodiment the opening of passage for the vacuum tank is disposed at the upper part of the wall of the lower box of the installation, the inner width of the opening of passage being smaller than the corresponding width of the air lock plate, but bigger than the corresponding dimension of the bearer plate for receiving the bottom of the magazine.

Suitably the vacuum tank is connected to the high vacuum processing chamber over a transport chamber, the connecting openings between the transport chamber and the vacuum tank or the processing chamber being fitted with lock and key and being closable over a slider or a valve body, and a transport arm being disposed swingable in the transport chamber, providing a substrate holder disposed at it, which on the one side can be moved up to the area of the magazine and on the other side up to the area of the substrate-coating or of the bed bolts, disposed in the processing chamber.

In order to render an exact placement of each substrate in the vacuum tank possible, the motor-drive-unit, which is connected with the air lock plate, allows to drive the post out gradually, as a function of the movement of the transport arm over a known electric step-by-step switch-device, the height of the vacuum tank being designed in such a way, that the lowest substrate held in the magazine can still be moved up to the swinging area of the substrate holder of the transport arm.

The invention allows very different examples of embodiment. One is represented in more details in the attached schematic figures:

Figure 1:
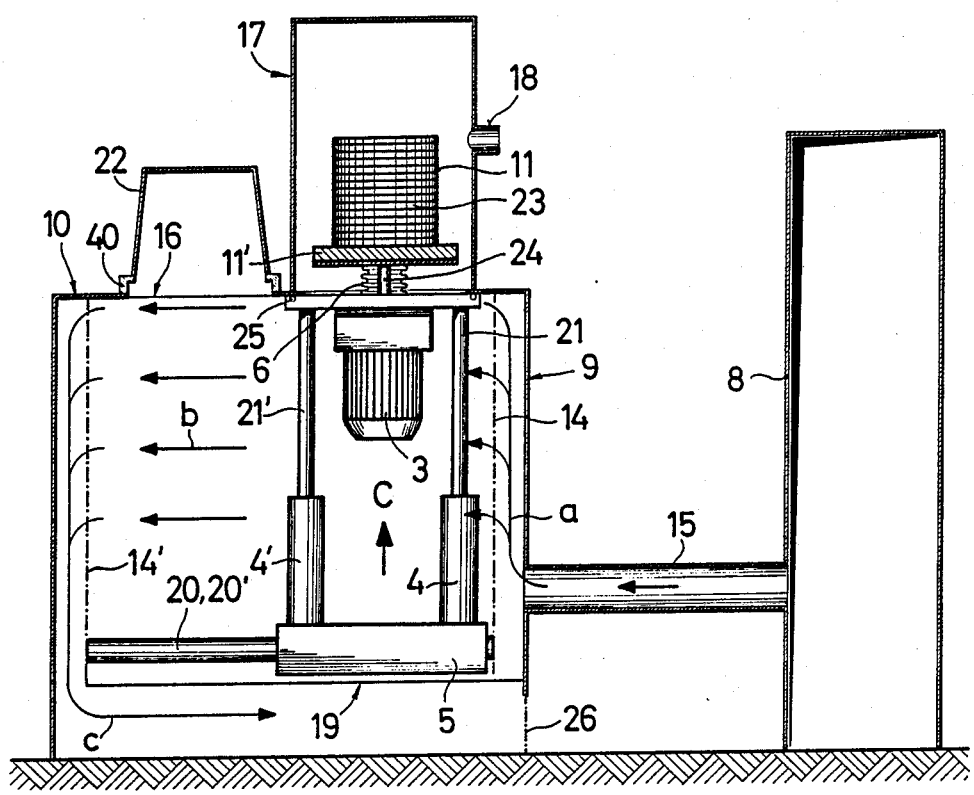
FIG. 1 is a partly diagrammatic elevational view in cross-section, of the lower box of the installation with a housing for a magazine resting on the lower box, the magazine being disposed in a vacuum chamber of the installation also represented in cross section and comprising a vacuum tank disposed on the upper part of the wall of the lower box.

The installation pursuant to FIG. 1 is basically composed of a box-shaped lower box (with an upper part of the wall 10 with a charge opening [air-lock-opening] 16, with a vacuum tank 17 resting on the lower box 9, with a motor-blower-unit 8, disposed next to the lower box 9, with a pipe conduit 15 connecting the motor-blower-unit 8 to the lower box 9, with a suction main 18 connecting the vacuum tank 17 to a set of pumps, which are not represented here, with a cage 19 disposed in the inner space of the lower box 9, the lateral walls of which are formed by perforated—or ribbed plates 14, 14′, with a conveying-slide-carriage 5 held and guided on parallel piston rods 20, 20;, with a drive unit 3 connected to the air lock plate 13.

Figure 2:
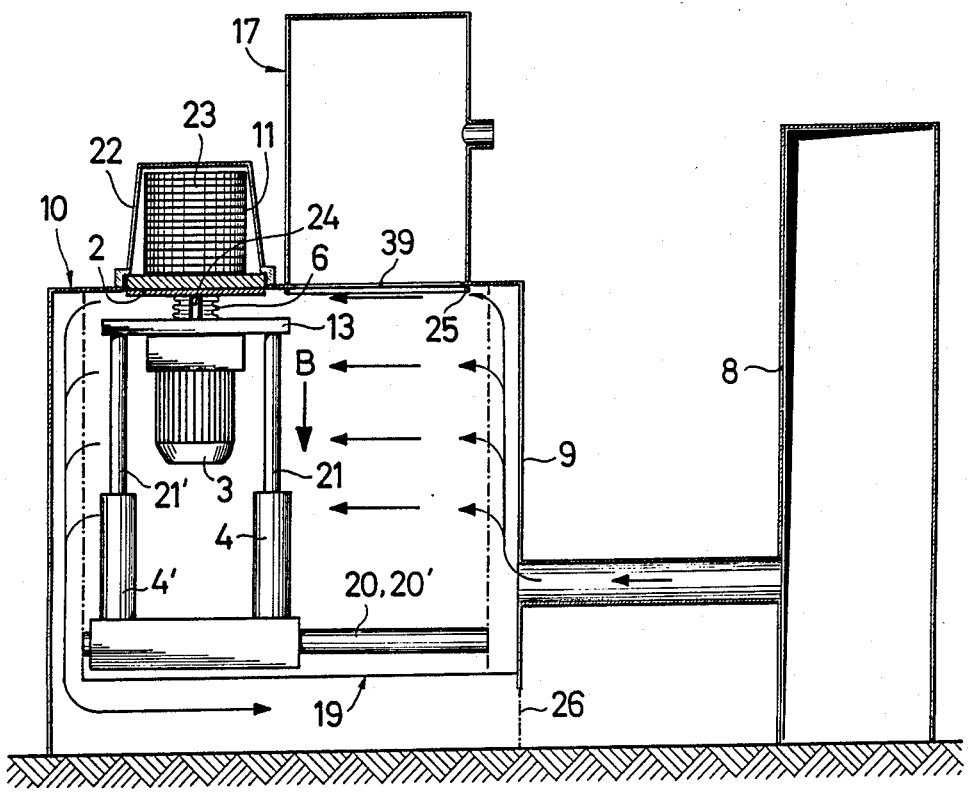
FIGS. 2 through 4 are partly diagrammatic elevational view in cross section of the installation pursuant to FIG. 1, the magazine being represented in different phases of the transporting path respectively.

As shown in FIG. 1, onto the upper part of the wall 10 of the lower box 9 in the area of the charge-opening [air-lock-opening] 16 rests the housing 22 of a magazine 11, being open on its lower side, the magazine providing a multitude of substrates 23, 23′. As represented in FIG. 2, the charge-opening [air-lock-opening] 16 is closed from below by a bearer plate 2 resting on a post 24, which is enclosed by a bellows 6 and which is movable over the drive unit 3 in vertical direction.

Figure 3:
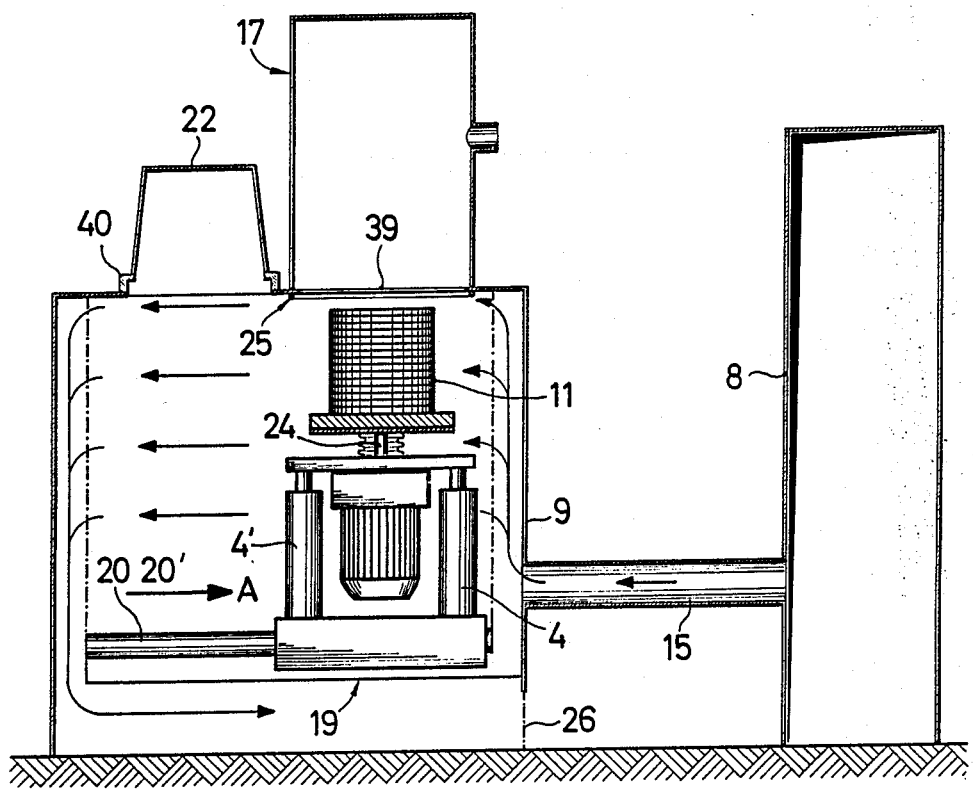
Figure 4:
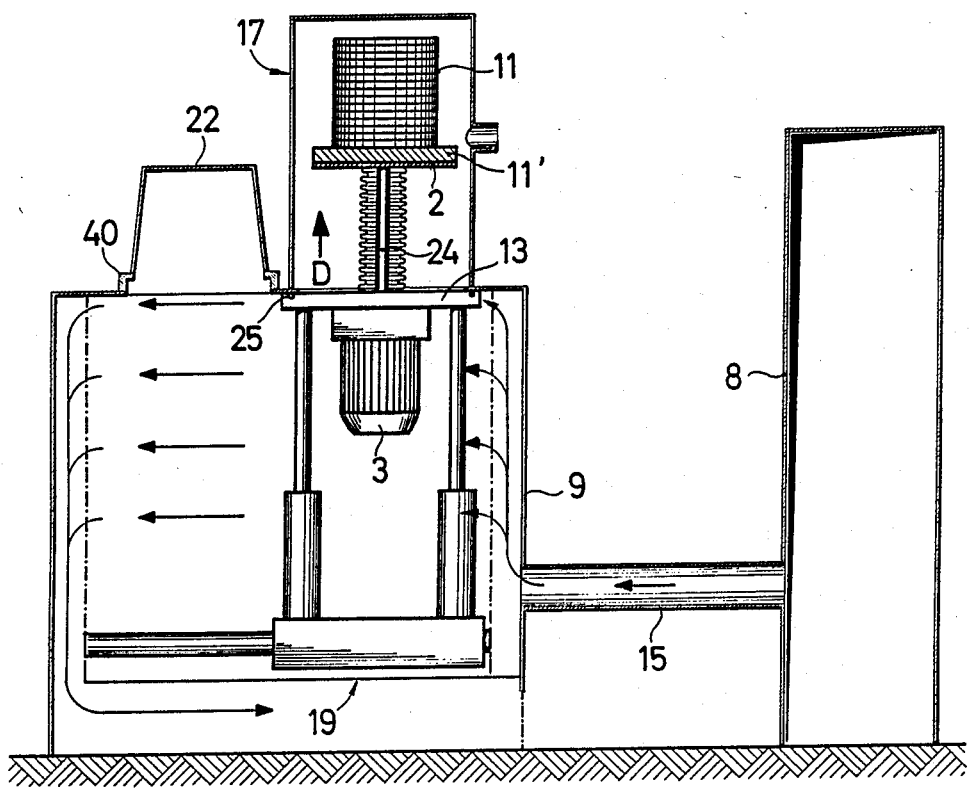

As can be concluded from FIG. 3, the magazine 23 can be moved into a lower position in which the charge-opening 16 is covered by the housing 22, by lowering down the air lock plate 13 by means of the lifting rods 21, 21′. Eventually the coping level of lock can be moved to the right on two parallel, horizontally disposed piston rods 20; 20′ in the direction of the arrow A, so that the magazine can be positioned exactly below the vacuum tank 17. By means of the two lifting cylinders 4, 4′ eventually the air lock plate 13 can be moved up vertically as seen by arrow C in FIG. 1, until the upper side of the air lock plate 13 lies against the frame-shaped sealing ring 25 at the lower side of the upper part of the wall 10. Finally the post 24 of the drive unit 3, which is composed of a motor—and a drive part, can be moved up vertically as to be seen in FIG. 4 by arrow D, the magazine 11, 11′, resting on the bearer plate 2 being movable up to the upper section of the vacuum tank 17.

As shown in FIGS. 1 through 4, air flows through the lower box 9 in direction of the arrows a, b or c, the air being brought into the lower part 9 by the blower-unit 8 over the piping conduit 15. In the lower box the air current 'a' is dispsered evenly over the entire height and then flows cross-wise in direction of the arrow 'b', eventually passes through the ribbed plate 14 on the opposite side of the lower box 9, and then flows down vertically along the inner wall of the lower box 9 and emerges out of the outlet opening 26 into the free air space in direction of the arrow 'c'. The blower unit 8 is fashioned in such a way, that it does not only bring air with a certain pressure and speed into the piping-conduit 15, but it is also conceived to purify the air sucked from the environment in a high measure, or to free it from dust particles.

Since all the movable parts of the installation are disposed in the lower box 9, the laminar air flowing through the lower box 9 is able to wash away all the abrasion, which might be produced on the substrates and the pieces in the inside of the installation, so that complete cleanness is achieved in the lower box.

Figure 5:
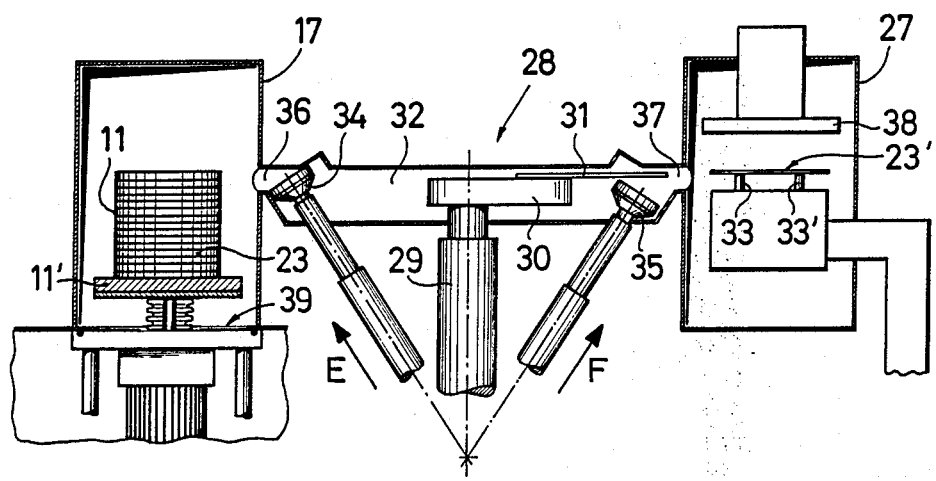
FIG. 5 is a partly diagrammatic elevational view of processing chamber connected to the vacuum chamber pursuant to the FIGS. 1 through 4 and a transport device, also represented in cross section connecting the processing chamber to the vacuum chamber.

As can be seen in FIG. 5, next to the installation represented in the FIGS. 1 through 4 a high vacuum processing chamber 27 is disposed, which is connected with the vacuum tank 17 over a charge and discharge device 28. The substrates 23, piled up in the magazine 11, 11′ are taken out of the magazine 11, 11′ by a transport arm 30 with a substrate holder 31 by a shaft 29, and eventually are moved out of the vacuum tank 17 by a swiveling movement, through the transport chamber 32 up to the high vacuum processing chamber 27 and here they are deposited onto the bed 33, 33′ . . . In order to avoid an unintentional pressure compensation between the high vacuum processing chamber 32, valve bodies 34, 35 are provided, which can close the connecting openings 36, 37 between the transport chamber 32 and the vacuum tank 17 or the processing chamber 27 respectively, by being moved in direction of the arrows E or F. A coating source is disposed in the processing chamber 27, by means of which the substrate 23′ can be treated.

| | | |
|---|---|---|
| 2 | Traegerplatte | bearing plate |
| 3 | Antriebseinheit | drive-unit |
| | Motor-Getriebeeinheit | motor-drive-unit |
| 4, 4′ | Hubzylinder | lifting cylinder |
| 5 | Transportschlitten | conveying-slide-carriage |
| 6 | Balgen | bellows |
| 7 | Dichtung | sealing |
| 8 | Geblaeseeinheit | blower-unit |
| 9 | Unterkasten | lower box |
| 10 | oberes Wandteil | upper part of the wall |
| 11, 11′ | Kassette | magazine |
| 12 | Reinraumboden | bottom of the clean space |
| 13 | Schleusenplatte | air lock plate |
| 14, 14′ | Rippenblech | ribbed plate |
| 15 | Rohrleitung | piping conduit |
| 16 | Einschleusoeffnung | charge opening [air-lock opening] |
| 17 | Vakuumkessel Vakuumkammer | vacuum tank |

| | | |
|---|---|---|
| 19 | Kaefig | cage [spacer] |
| 20, 20′ | Kolbenstange | piston rod |
| 21, 21′ | Hubstange | lifting rod |
| | Hubglied | lifting member |
| 22 | Gehaeuse | housing |
| 23, 23′ | Substrat | substrate |
| 24 | Stempel | post |
| 25 | rahmenfoermiger Dichtring | frame-shaped sealing ring |
| 26 | Auslassoeffnung | outlet opening |
| 27 | Hochvakuum-prozesskammer | high-vacuum-processing-chamber |
| 28 | Be- und Entlade- | loading- and unloading device |

| | vorrichtung | [charging- and discharging d.] |
|---|---|---|
| 29 | Welle | shaft |
| 30 | Transportarm | transport arm |
| 31 | Substrathalter | substrate holder |
| 32 | Transportkammer | transport chamber |
| 33, 33' | Traegerbolzen | bed bolt |
| 34, 35 | Ventilkoerper | valve body |
| 36, 37 | Anschlussoeffnung | connecting opening |
| 38 | Beschichtungsquelle | coating source |
| 39 | Durchlass | opening of passage |
| 40 | Rahmenteil | |

We claim:

1. Apparatus for the charge and discharge of substrates in a vacuum tank having an opening, into a prechamber of a high vacuum processing chamber for treating the surfaces of the substrates, comprising: a substrate holder, a substrate store, an air lock plate onto which the substrate store can be disposed, a first housing having a charge opening, which is open towards a lower side of the first housing enclosing the store, the first housing having a rotatable lower border, a lower box enclosing the apparatus and having a wall having an upper portion on which the rotatable lower border rests, means for moving the air lock plate vertically and horizontally, the first housing resting sealingly on the lower box and closing the charge-opening for the substrate store, said means for moving the air lock plate being positioned to move the air lock plate to the opening of the tank, the opening of the tank being connected to the lower box and being closable.

2. Apparatus according to claim 1, in which the lower box includes a wall having an upper part and in which the housing, which rests on the upper part of the wall of the lower box for the substrate store, has a frame-piece, which embraces the charge-opening, the inner width of which frame-piece corresponds approximately to the inner width of the charge-opening.

3. Apparatus according to claim 1, in which the lower box has an outlet opening for an air current flowing through the lower box, and a piping conduit connected to the lower box and connected to a motor-blower-filter-unit.

4. Apparatus according to claim 3, which includes a cage disposed inside the lower box and having perforated plates and in which the lifting means is enclosed at least in part by the cage, the air current entering over the piping conduit and flowing through the cage.

5. Apparatus according to claim 1, in which said moving means comprises a conveying sliding carriage and rods, the carriage being disposed gliding on the rods, the conveying sliding carriage having lifting cylinders and piston rods which carry the air lock plate, a driving unit attached to the air lock plate, a post acted upon by said driving unit and having a free end, a bearing plate disposed on the free end of the post and serving to hold the store.

6. Apparatus according to claim 5, in which the opening of the vacuum tank is disposed at the upper part of the wall of the lower box, the inner width of the opening being smaller, than the corresponding width of of the air lock plate, but bigger than the corresponding dimension of the bearing plate.

7. Apparatus according to claim 5, which includes a high-vacuum-processing-chamber and a transporting chamber connecting the high-vacuum-processing chamber to the vacuum tank, the transporting chamber and the vacuum tank and the processing chamber having connecting openings, a valve body, and a transport arm with a substrate holder thereat being disposed swingable in the transport chamber, the transport arm being movable on one side to the area of the substrate store and on another side to the area of a substrate disposed in the processing chamber.

8. Apparatus according to claim 7, which includes a motor-drive-unit, which is connected to the air lock plate and renders a driving out step-by-step of the post as a function of the movement of the transport arm over an electric step-by-step switching-device, the height of the vacuum tank being so selected that the lowest substrate held in the substrate store can be moved up to the swinging area of the substrate holder of the transport arm.

* * * * *

UNITED STATES PATENT AND TRADEMARK OFFICE
CERTIFICATE OF CORRECTION

PATENT NO. : 4,907,526

DATED : March 13, 1990

INVENTOR(S) : Walde et al.

It is certified that error appears in the above-identified patent and that said Letters Patent is hereby corrected as shown below:

Column 2, line 13 for "t which" read -- to which --.

Column 3, line 59 for "motor-" read -- motor --.

Column 3, line 68 for "dispsered" read -- dispersed --.

Column 4, line 40 to column 5, line 13: Delete all text.

Signed and Sealed this

Eleventh Day of February, 1992

Attest:

HARRY F. MANBECK, JR.

*Attesting Officer*  *Commissioner of Patents and Trademarks*